United States Patent [19]

Takano

[11] Patent Number: 5,412,339
[45] Date of Patent: May 2, 1995

[54] HIGH FREQUENCY AMPLIFIER

[75] Inventor: Isamu Takano, Tokyo, Japan

[73] Assignee: NEC Corporation, Tokyo, Japan

[21] Appl. No.: 258,816

[22] Filed: Jun. 13, 1994

[30] Foreign Application Priority Data

Jun. 11, 1993 [JP] Japan .................. 5-139739

[51] Int. Cl.$^6$ .............................................. H03F 3/60
[52] U.S. Cl. ...................................... 330/54; 330/286; 330/306
[58] Field of Search ................ 330/54, 277, 286, 306, 330/307

[56] References Cited

U.S. PATENT DOCUMENTS

| 3,210,682 | 10/1965 | Sosin | 330/54 |
| 4,311,966 | 1/1982 | Bert et al. | |
| 4,486,719 | 12/1984 | Ayasli. | |
| 4,947,136 | 8/1990 | Helms. | |

FOREIGN PATENT DOCUMENTS

| 0332431A3 | 9/1989 | European Pat. Off. . |
| 53-117360 | 10/1978 | Japan . |
| 59-138110 | 8/1984 | Japan . |
| 62-41448 | 10/1987 | Japan . |
| 2194110 | 2/1988 | United Kingdom . |

OTHER PUBLICATIONS

European Search Report.
B. J. Minnis; "Extending the Frequency Range of Distributed Amplifiers with Bandpass Filter Structures"; Microwave Journal, vol. 32, No. 8, Aug. 1989; pp. 109–122.

Primary Examiner—James B. Mullins
Attorney, Agent, or Firm—Whitham, Curtis, Whitham & McGinn

[57] ABSTRACT

A high frequency amplifier has a distributed amplifier having a sufficiently wide band and formed on a microwave integrated circuit, and at least one bandpass filter directly connected to the distributed amplifier and formed of a microstrip line having a desired frequency band having a desired center frequency.

19 Claims, 7 Drawing Sheets

HIGH FREQUENCY AMPLIFIER

BACKGROUND OF THE INVENTION

1. Field of the Invention

The present invention relates to a high frequency amplifier, and more specifically to a high frequency amplifier having a desired band width, for use in a tuner circuit for an optical communication system, radio communication system, a television receiver, and the like.

2. Description of Related Art

With advance of optical transmission technology, research is now being conducted for a high speed optical transmission system using an optical device of a long wave band and a single mode fiber, which enable a large amount of long distance transmission. In particular, in order to realize a wide band information communication network for giving a variety of communication services including images, data and audio, it is desired to speed up and stabilize the above mentioned optical transmission system. In addition, a basic transmission line or truck used in this wide band information communication network is required to have a channel capacity of a few gigabits per second in the case of a time division multiplexed transmission line, and optical transmitter/receiver apparatuses included in the optical transmission system are required to have a wide band and a high speed operation.

A fundamental function, which should be possessed by the optical transmitter/receiver apparatuses, can be basically divided into three "R"s, namely, a reshaping by an equalizing amplification, a retiming and a regeneration. Here, the retiming means to a timing signal extraction function for extracting from a received data signal a timing signal in synchronism with a transmission channel data rate, and for supplying the extracted timing signal to an identification circuit and a multiplexing terminal.

In tuners used in mobile communication instruments such as portable telephone and in television receivers included in domestic electronic instruments, on the other hand, there is a large demand for miniaturization, low power consumption and low cost. Under this circumstance, efforts are being made for implementing a high frequency circuit for these instruments on an integrated circuit.

In the optical transmitter/receiver apparatuses and tuners as mentioned above, it is a matter of course that a wide band amplification circuit is significant as one constituent, but amplification circuits having a relative narrow band width, used in an intermediate frequency circuit, for amplifying only a signal within a desired band width, are also a significant constituent.

Referring to FIG. 1, there is shown an example of an ordinary conventional high frequency circuit used in a timing extracting circuit of the above mentioned optical transmitter/receiver apparatuses. The shown high frequency circuit uses GaAs field effect transistors $Q_{101}$ and $Q_{102}$ for the purpose of obtaining a signal amplification characteristics in a desired band width, and between the transistors $Q_{101}$ and $Q_{102}$ there are connected a bandpass filter 101 which has the above mentioned desired band width and composed of a concentrated constant circuit or lumped element circuit including inductors and capacitors. For example, this conventional high frequency amplifier has a characteristic having a band width of 1 GHz in a 5 GHz band, namely, $Q=5$.

Turning to FIG. 2, there is shown a second example of the conventional high frequency amplifier, in which an operating frequency band is made higher than that of an amplifier by using a microstrip line formed on a thin film (hybrid) integrated circuit. This conventional high frequency amplifier includes an impedance matching stub circuit 201 which is located at an input side of a transistor $Q_{201}$ for amplification and which is formed of a microstrip line. In this conventional circuit, since the impedance matching circuit is designed to match with a frequency characteristics of the transistor $Q_{201}$, it is possible to easily realize a high frequency amplifier having a desired band characteristics, within a frequency zone of a 10 GHz band.

In addition, referring to FIG. 3, there is shown a third example of the conventional high frequency amplifier, which is disclosed in Japanese Utility Model Postexamination Publication No. Sho 62-41448. This conventional high frequency amplifier includes amplifying transistors $Q_{301}$ and $Q_{302}$ having a waveguide matching circuit at an input side and at an output side, respectively, and a filter 301 formed of a constant-resistance bridged-T circuit for compensating an amplitude in a desired band. This circuit is characterized in that, by utilizing a constant resistance property of the bridged-T circuit having the desired band, the amplifier is constituted in a conjugate matching condition viewed from the output terminal of the transistor $Q_{302}$. With this feature, a flat frequency characteristic can be obtained while maintaining a low noise property and a linearity.

However, the first conventional example as mentioned above using the lumped element circuit, is disadvantageous in that a realizable frequency is on the order of 5 GHz, because the operating frequency is restricted by influence of floating elements.

In the second embodiment using the microstrip line formed on the hybrid integrated circuit, and in the third embodiment using the waveguide circuit elements, the realizable frequency can be elevated to 10 GHz. However, since it is necessary to design the impedance matching circuit by taking into consideration the frequency characteristics of the transistors for the purpose of realizing the desired frequency characteristics, it is impossible to individually design each of the amplification section and the bandpass filter section, independently of the others. Therefore, the design becomes a single-purpose design, and accordingly, can have neither a general-purpose design nor a flexibility in design.

SUMMARY OF THE INVENTION

Accordingly, it is an object of the present invention to provide a high frequency amplifier which has overcome the above mentioned defect of the conventional ones.

Another object of the present invention is to provide a high frequency amplifier having a further elevated operating frequency and an excellent flexibility in circuit design.

The above and other objects of the present invention are achieved in accordance with the present invention by a high frequency amplifier comprising a distributed amplifier having a frequency-to-gain characteristic of a first frequency band which is sufficiently wider than a predetermined second frequency band, the distributed amplifier including a plurality of amplifying elements which are formed on a microwave integrated circuit and which are incorporated in a transmission circuit so that an inter-electrode capacitance of the amplifying elements becomes a portion of circuit elements of the transmission circuit, and a bandpass filter connected to at least one of an input and an output of the distributed amplifier, the bandpass filter having a desired center frequency within the first frequency band and a bandpass characteristic corresponding to the second frequency band, the bandpass filter being formed of a microstrip line.

The above and other objects, features and advantages of the present invention will be apparent from the following description of preferred embodiments of the invention with reference to the accompanying drawings.

DESCRIPTION OF THE PREFERRED EMBODIMENTS

Figure 1:
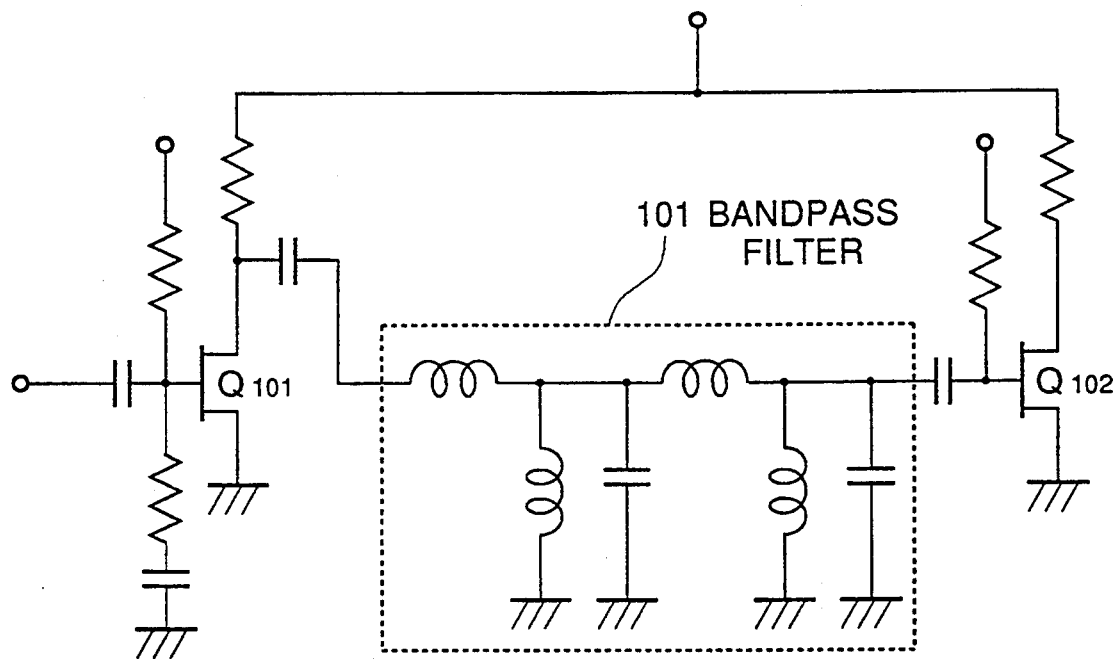
FIG. 1 is a circuit diagram illustrating a first example of the conventional high frequency amplifier.
Figure 2:
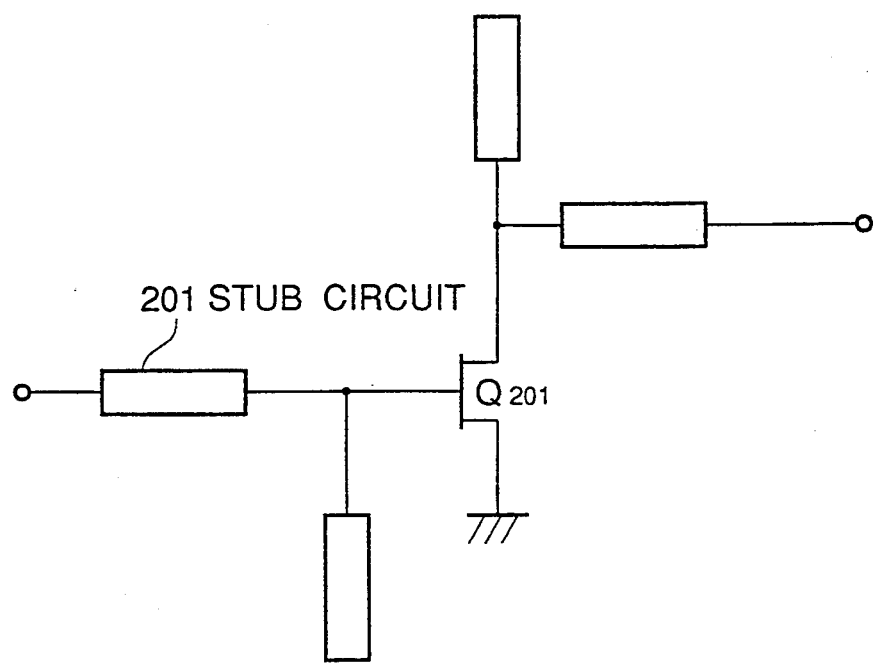
FIG. 2 is a circuit diagram illustrating a second example of the conventional high frequency amplifier.
Figure 3:
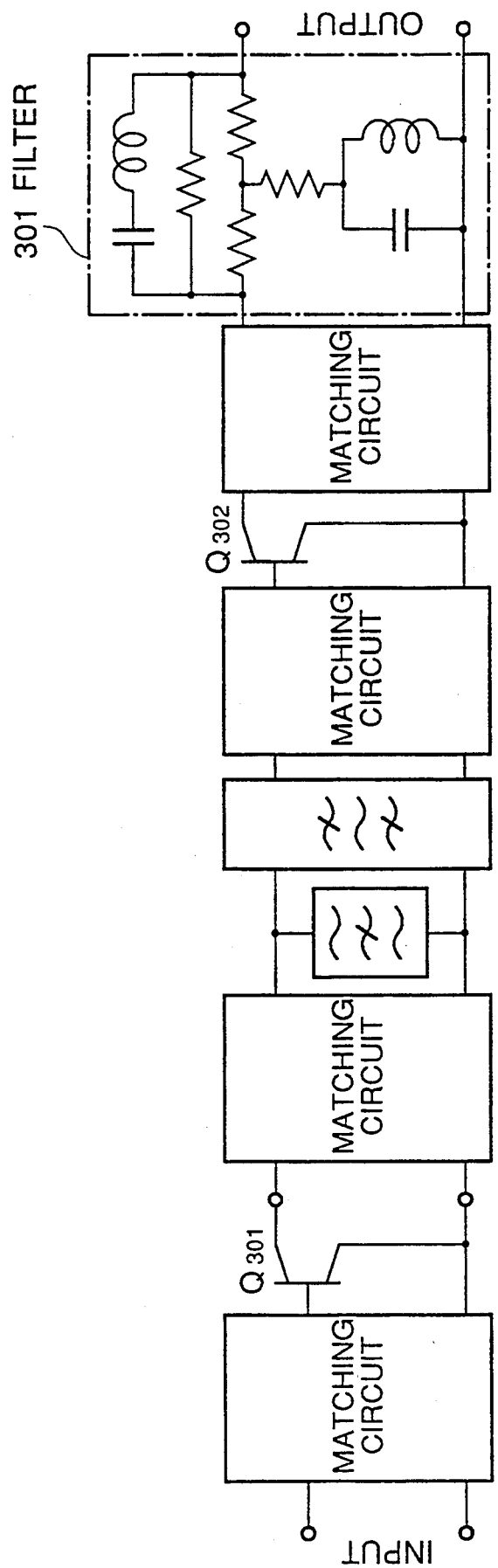
FIG. 3 is a circuit diagram illustrating a third example of the conventional high frequency amplifier.
Figure 4:
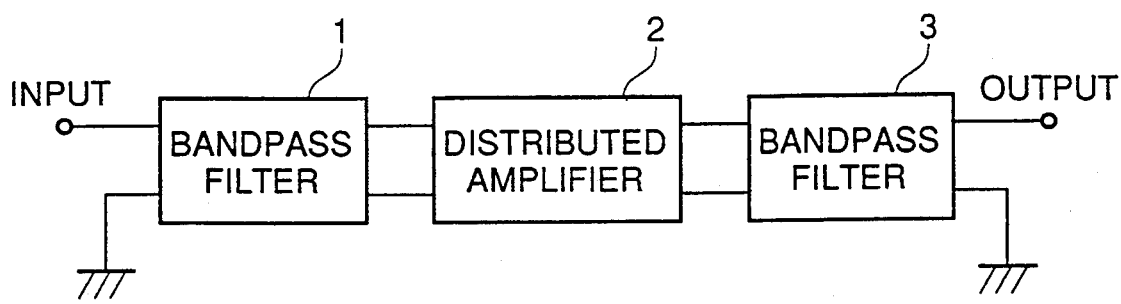
FIG. 4 is a block diagram of one embodiment of the high frequency amplifier in accordance with the present invention.

Referring to FIG. 4, there is shown a block diagram of one embodiment of the high frequency amplifier in accordance with the present invention. The shown embodiment of the high frequency amplifier in accordance with the present invention, includes a reflection type constant-resistance bridged-T bandpass filters 1 and 3, which are located at an input and an output of the high frequency amplifier, and a distributed amplifier 2 formed of a microwave integrated circuit, located between the bandpass filters 1 and 3.

As well known to persons skilled in the art, the distributed amplifier 2 is constituted by incorporating a plurality of amplifying elements into a transmission circuit in such a manner that an inter-electrode capacitance of each amplifying element constitutes a portion of circuit elements of the transmission circuit. The distributed amplifier 2 is characterized in that it can amplify over a super wide band of several octaves and has an excellent gain flatness in the frequency band and a small reflection loss of input and output signals.

Figure 5:
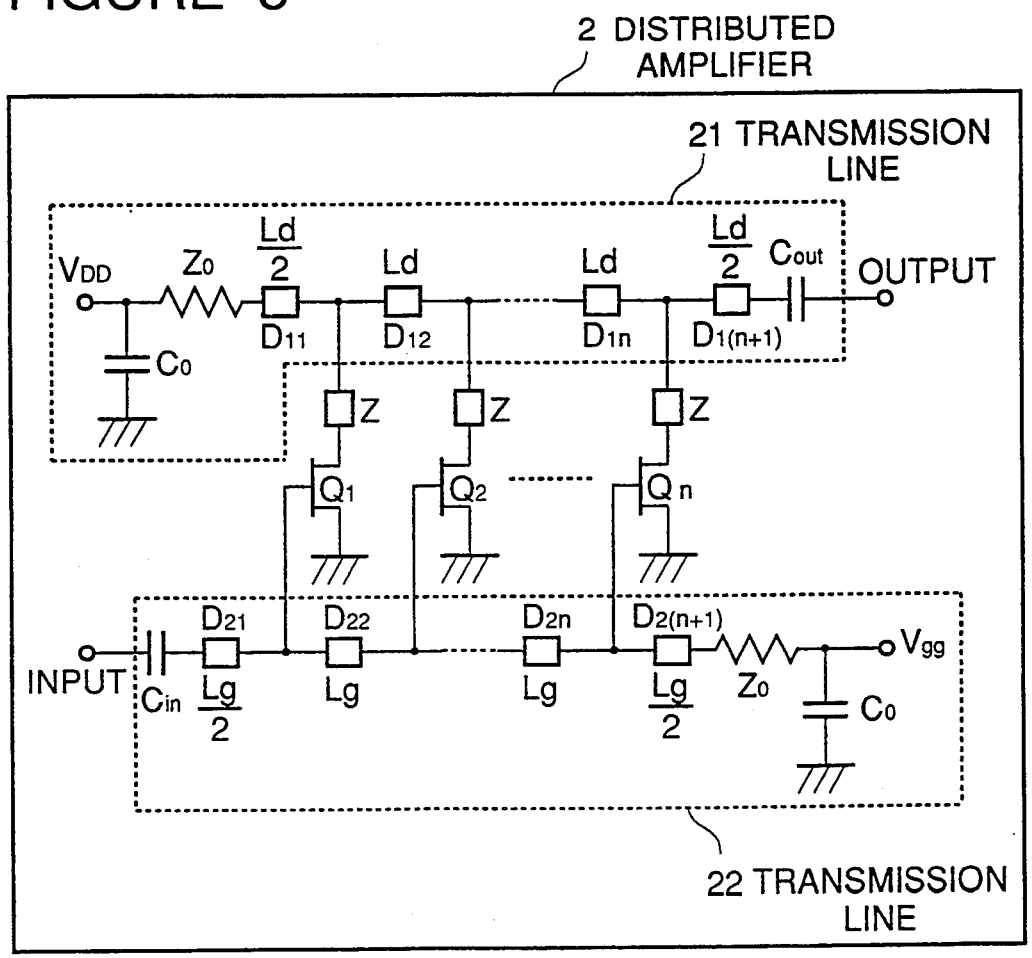
FIG. 5 is a circuit diagram of the distributed amplifier incorporated in the embodiment of the high frequency amplifier in accordance with the present invention.

Referring to FIG. 5, there is shown a circuit construction of the distributed amplifier 2. The shown distributed amplifier 2 includes a plurality of source-grounded amplifying transistors $Q_1$ to $Q_n$, an output side transmission line 21 having a plurality of phase-matching delay elements of the delay amount of $L_d/2$ or $L_d$, and an input side transmission line 22 having a plurality of phase-matching delay elements of the delay amount of $L_d/2$ or $L_d$, which are connected as shown.

In the input side transmission line 22, more specifically, an input terminal INPUT is connected through a capacitor $C_{in}$, delay elements $D_{21}$, $D_{22}$, ..., $D_{2n}$, $D_{2(n+1)}$, and a resistor or inductor $Z_0$ in the named order to Vgg. An end of the resistor $Z_0$ connected to Vgg is connected through a capacitor $C_0$ to the ground. The delay elements $D_{21}$ and $D_{2(n+1)}$ have the delay amount of $L_d/2$, and the other delay elements have the delay amount of $L_d$. A connection node between the first and second delay elements $D_{21}$ and $D_{22}$ is connected to a gate of the source-grounded transistor $Q_1$, and a connection node between the second delay element $D_{22}$ and the third delay element (not shown) is connected to a gate of the source-grounded transistor $Q_2$. Similarly, a connection node between the (n)th and (n+1)th delay elements $D_{2n}$ and $D_{2(n+1)}$, is connected to a gate of the source-grounded transistor $Q_n$.

In the output side transmission line 21, $V_{DD}$ is connected through a resistor or inductor $Z_0$, delay elements $D_{11}$, $D_{12}$, ..., $D_{1n}$, $D_{1(n+1)}$, and a capacitor $C_{out}$ in the named order to an output terminal OUTPUT. An end of the resistor $Z_0$ connected to $V_{DD}$ is connected through a capacitor $C_0$ to the ground. The delay elements $D_{11}$ and $D_{1(n+1)}$ have the delay amount of $L_d/2$, and the other delay elements have the delay amount of $L_d$. A connection node between the first and second delay elements $D_{11}$ and $D_{12}$ is connected to a drain of the source-grounded transistor $Q_1$ through a resistor $Z$, and a connection node between the second delay element $D_{12}$ and the third delay element (not shown) is connected to a drain of the source-grounded transistor $Q_2$ through a resistor $Z$. Similarly, a connection node between the (n)th and (n+1)th delay elements $D_{1n}$ and $D_{1(n+1)}$, is connected to a drain of the source-grounded transistor $Q_n$ through a resistor $Z$.

The shown distributed amplifier 2 has an excellent characteristic that the gain is 8 dB or more in a frequency band from 2 GHz to 20 GHz. This type of distributed amplifier is described in for example Electronics Information Communication Society (of Japan), "Electronics Device Research Group, ED-86-10(1986-5), the disclosure of which is incorporated by reference in its entirety into this application.

Figure 6:
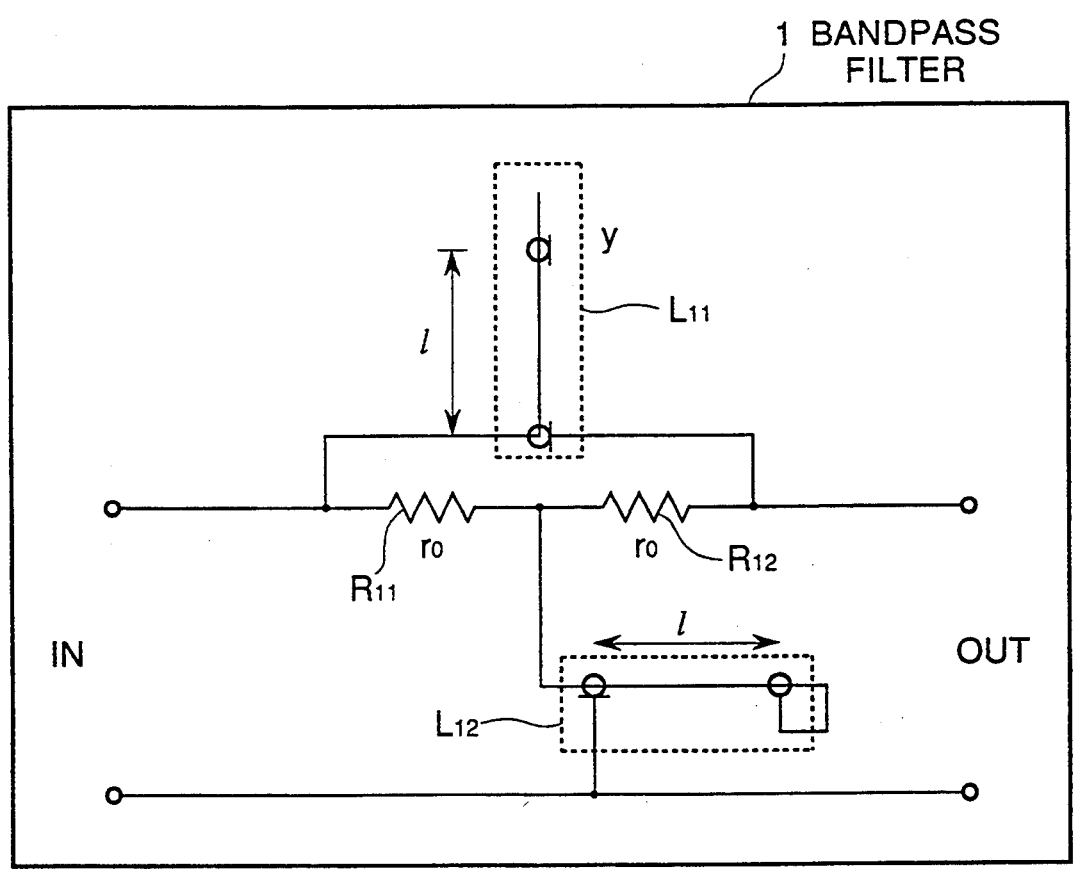
FIG. 6 is a circuit diagram of the bandpass filter incorporated in the embodiment of the high frequency amplifier in accordance with the present invention.

Referring to FIG. 6, there is shown a circuit diagram of the bandpass filters 1 and 3. The shown bandpass filter 1 and 3 includes series-connected resistor $R_{11}$ and $R_{12}$ of the same resistance $r_0$ connected between an input terminal IN and an output terminal OUT, a line $L_{11}$ formed of a microstrip line including a signal conductor and a ground conductor which are separated by a dielectric substrate, the line $L_{11}$ having a line length l, the signal conductor and the ground conductor of one end of the strip line $L_{11}$ being opened, the signal conductor of the other end of the strip line $L_{11}$ being connected to the input IN, and the ground conductor of the other end of the strip line $L_{11}$ being connected to the output OUT, and another line $L_{12}$ formed of a microstrip line including a signal conductor and a ground conductor which are separated by a dielectric substrate, the line $L_{12}$ having a line length l, the signal conductor and the ground conductor of one end of the line $L_{12}$ being short-circuited, the signal conductor of the other end of the line $L_{12}$ being connected to a connection node between the resistors $R_{11}$ and $R_{12}$, and the ground conductor of the other end of the line $L_{12}$ being connected to the ground.

These bandpass filters 1 and 3 has various advantages of the reflection type constant-resistance bridged-T circuit, in which (1) since it is a passive circuit of the constant-resistance type, a connection coupling and a connection to another circuit are easy, (2) since the circuit construction is very simple, it can be very easily implemented on an integrated circuit, (3) it is possible to nullify a phase loss and insertion loss, and (4) a high frequency characteristic is excellent since it can be constructed from only distributed constant circuits and resistors.

An ideal equalization characteristics of the bandpass filter is expressed by $R(x)=\sin \pi x$, and the line length l can be obtained from $l=C/4f$, where C is a propagation speed in the distributed line, and f is a center frequency of passband. Accordingly, in the case of constituting a bandpass filter of a 10 GHz band using a ceramic substrate having a dielectric constant of 10, it is possible to easy manufacture a filter having the line length l of about 5 mm and a passband width on the order of 2 GHz (Q=5).

Figure 7A:
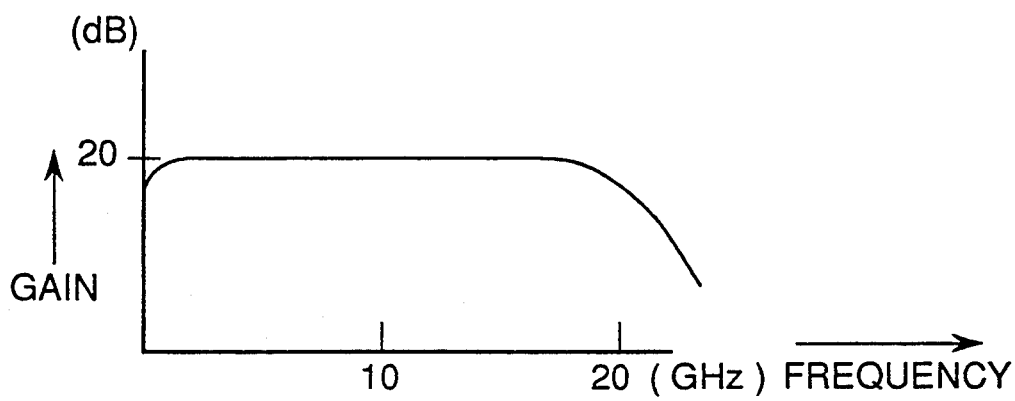
FIGS. 7A, 7B and 7C are graphs illustrating the frequency-to-gain characteristics of the embodiment of the high frequency amplifier in accordance with the present invention.
Figure 7B:
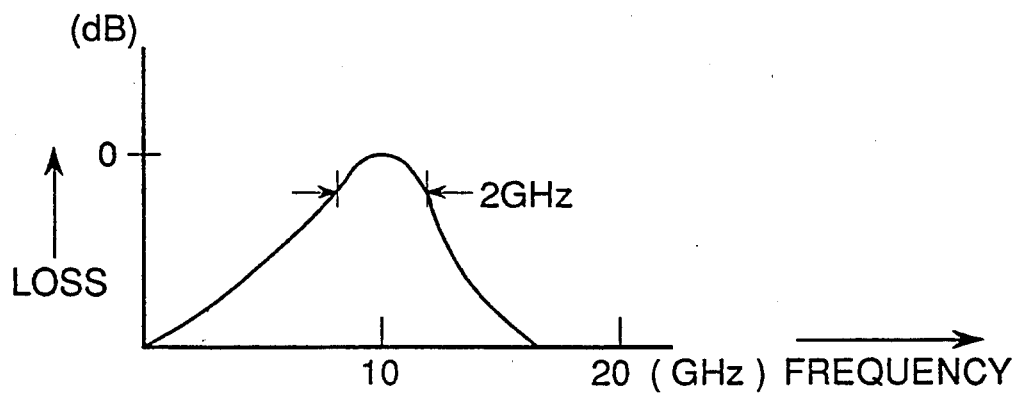
Figure 7C:
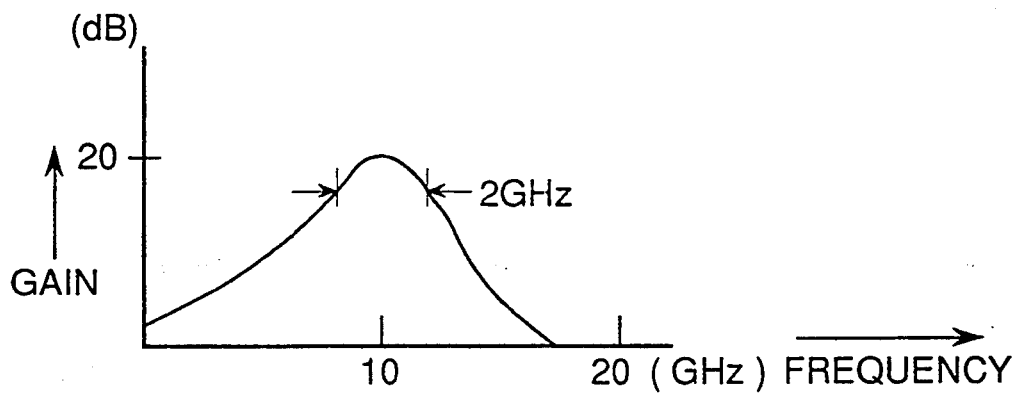

Turning to FIGS. 7A, 7B and 7C, there are illustrated frequency transmission characteristics of the high frequency amplifier in accordance with the present invention. FIG. 7A shows a frequency-to-gain characteristic of the distributed amplifier 2, which indicates a superwide band characteristic in which the gain of 20 dB extends over a frequency band from 1 GHz to 20 GHz. FIG. 7B shows a frequency band characteristic of the bandpass filter 1 and 3, which illustrates the gain of 0 dB over a bandwidth of 2 GHz having a center frequency of 10 GHz. FIG. 7C shows a total transmission characteristic of the high frequency amplifier of this embodiment. This total transmission characteristic shows the gain of 20 dB over a bandwidth of 2 GHz having a center frequency of 10 GHz. Namely, by modifying the bandpass characteristics of the bandpass filters 1 and 3, it is possible to easily construct the high frequency amplifier having a desired bandpass characteristic.

Figure 8A:
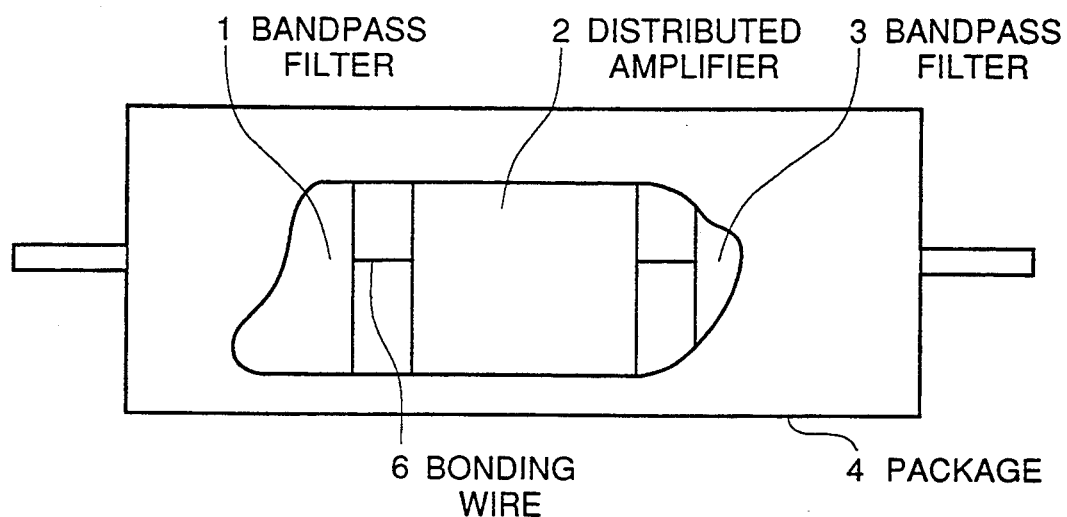
FIGS. 8A and 8B are a partially broken plan view and a sectional view of a first example of a specific structure of the high frequency amplifier in accordance with the present invention.
Figure 8B:
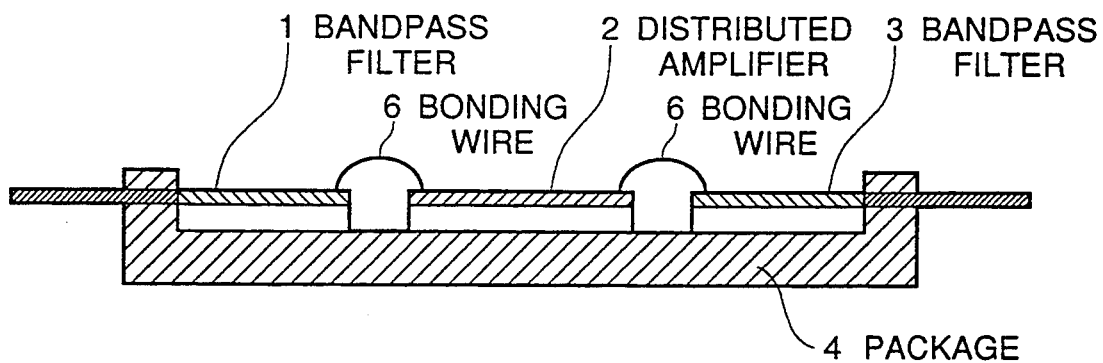

Referring to FIGS. 8A and 8B, there are shown a partially broken plan view and a cap-removed sectional view of a first example of a specific structure of the high frequency amplifier in accordance with the present invention. The shown high frequency amplifier structure includes a ceramic package 4. The bandpass filters 1 and 3, each of which is formed on a discrete thin film integrated circuit substrate or a discrete monolithic microwave integrated circuit (MMIC) substrate, are located on opposite end portions of the ceramic package 4, and the distributed amplifier 2, which is also formed on a discrete MMIC substrate, is located between the bandpass filters 1 and 3 on the ceramic package 4. Connection between the distributed amplifier 2 and each of the bandpass filters 1 and 3 is made by a bonding wire 6.

In the high frequency amplifier of this embodiment, accordingly, it is possible to manufacture and adjust the bandpass filters 1 and 3 and the distributed amplifier 2, independently of one another, before they are assembled on the package 4. Therefore, it is possible to increase the production yield and the degree of freedom in design.

Figure 9A:
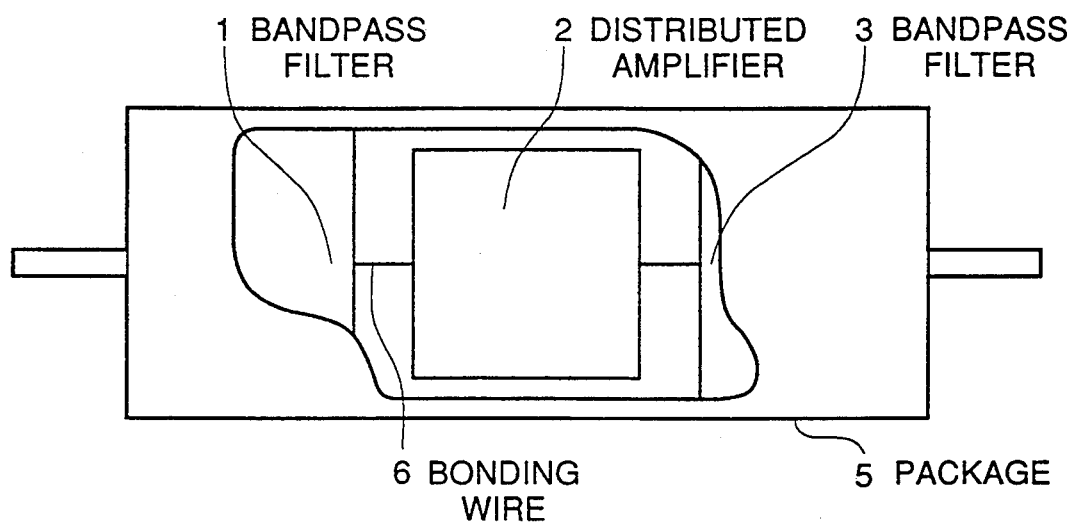
FIGS. 9A and 9B are a partially broken plan view and a sectional view of a second example of a specific structure of the high frequency amplifier in accordance with the present invention.
Figure 9B:
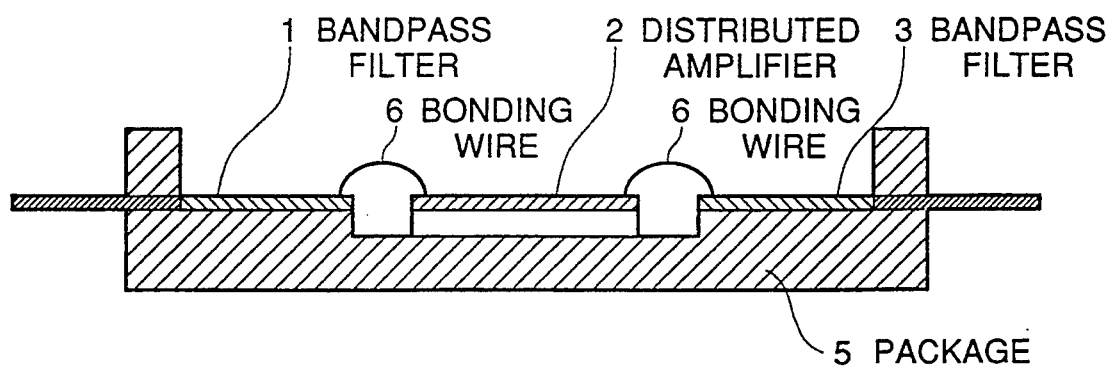

Referring to FIGS. 9A and 9B, there are shown a partially broken plan view and a cap-removed sectional view of a second example of a specific structure of the high frequency amplifier in accordance with the present invention. In place of the package 4, the shown second example includes a package 5 having opposite end portions which constitute an input section and an output section and on which the bandpass filters 1 and 3 are directly formed by a thin film technique or a thick film technique. Since the bandpass filters are formed directly on the package, this second example is more excellent in mass producibility, and can further reduce floating elements. Accordingly, a high frequency amplifier operable in a high frequency zone can be easily realized.

As mentioned above, the high frequency amplifier in accordance with the present invention has a sufficiently wide band distributed amplifier formed on a microwave integrated circuit and at least one bandpass filter directly connected to the distributed amplifier and formed of a microstrip line having a desired frequency band having a desired center frequency. Accordingly, it is possible to greatly reduce influence of the floating element, and to elevate the realizable frequency defined by the limit of the operating frequency to 20 GHz or more. Since the bandpass filter can be designed, manufactured and adjusted independently of the distributed amplifier, it is possible to realize the high frequency amplifier having a desired center frequency and a desired bandwidth by modifying only the characteristics of the bandpass filter. Therefore, it is excellent in generality and flexibility of design. Furthermore, it is possible to reduce the number of necessary steps in a manufacturing process, and thus reduce the manufacturing cost. Accordingly, the high frequency amplifier in accordance with the present invention is excellent in producibility.

The invention has thus been shown and described with reference to the specific embodiments. However, it should be noted that the present invention is in no way limited to the details of the illustrated structures but changes and modifications may be made within the scope of the appended claims.

I. Claim:

1. A high frequency amplifier, comprising:
a distributed amplifier having a frequency-to-gain characteristic of a first frequency band which is wider than a predetermined second frequency band, said distributed amplifier including a plurality of amplifying elements which are formed on a microwave integrated circuit and which are incorporated in a transmission circuit so that an interelectrode capacitance of the amplifying elements becomes a portion of circuit elements of said transmission circuit, and
a bandpass filter connected to at least one of an input and an output of said distributed amplifier,
said bandpass filter having a desired center frequency within said first frequency band and a bandpass characteristic corresponding to said second frequency band, said bandpass filter being formed of a microstrip line.

2. A high frequency amplifier claimed in claim 1 wherein said bandpass filter comprises a reflection type bridged-T bandpass filter, said reflection type bridged-T bandpass filter including:

series-connected first and second resistors having a predetermined resistance and connected between an input terminal and an output terminal, a first microstrip line having a first conductor and a second conductor, a first end of said first conductor and a first end of said second conductor being opened, a second end of said first conductor being connected to said input terminal, and a second end of said second conductor being connected to said output terminal, and a second microstrip line having a third conductor and a fourth conductor, a first end of said third conductor and a first end of said fourth conductor being short-circuited, a second end of said third conductor being connected to a connection node between said first and second resistors, and a second end of said fourth conductor being connected to ground.

3. A high frequency amplifier claimed in claim 1 wherein said bandpass filter is formed on a discrete substrate as one of a thin film hybrid integrated circuit, a thick film hybrid integrated circuit and a monolithic integrated circuit, said bandpass filter and said distributed amplifier being assembled on a single package.

4. A high frequency amplifier claimed in claim 1 wherein said bandpass filter is formed as one of a thin film hybrid integrated circuit, a thick film hybrid integrated circuit and a monolithic integrated circuit, which uses an internal surface of a package as a substrate, said distributed amplifier being assembled on said package.

5. A high frequency amplifier claimed in claim 1, wherein said bandpass filter comprises a bridged-T bandpass filter.

6. A high frequency amplifier claimed in claim 5, wherein said bridged-T bandpass filter includes series-connected first and second resistors having a predetermined resistance and connected between an input terminal and an output terminal.

7. A high frequency amplifier claimed in claim 6, wherein said bridged-T bandpass filter further includes a first microstrip line having a first conductor and a second conductor.

8. A high frequency amplifier claimed in claim 7, wherein a first end of said first conductor and a first end of said second conductor are opened and a second end of said first conductor is connected to said input terminal, a second end of said second conductor being connected to said output terminal.

9. A high frequency amplifier claimed in claim 7, wherein said bridged-T bandpass filter further includes a second microstrip line having a third conductor and a fourth conductor.

10. A high frequency amplifier claimed in claim 9, wherein a first end of said third conductor and a first end of said fourth conductor are short-circuited, a second end of said third conductor being connected to a connection node between said first and second resistors, and a second end of said fourth conductor being connected to ground.

11. A high frequency amplifier, comprising:

a distributed amplifier having a frequency-to-gain characteristic of a first frequency band which is wider than a predetermined second frequency band, said distributed amplifier including a plurality of amplifying elements which are formed on an integrated circuit, and a bandpass filter connected to at least one of an input an output of said distributed amplifier, said bandpass filter having a desired center frequency within said first frequency band and a bandpass characteristic corresponding to said second frequency band.

12. A high frequency amplifier claimed in claim 11, wherein said plurality of amplifying elements are incorporated in a transmission circuit so that an inter-electrode capacitance of the amplifying elements becomes a portion of circuit elements of said transmission circuit.

13. A high frequency amplifier claimed in claim 12, wherein said bandpass filter comprises a microstrip line.

14. A high frequency amplifier claimed in claim 11, wherein said bandpass filter comprises a bridged-T bandpass filter.

15. A high frequency amplifier claimed in claim 14, wherein said bridged-T bandpass filter includes series-connected first and second resistors having a predetermined resistance and connected between an input terminal and an output terminal.

16. A high frequency amplifier claimed in claim 15, wherein said bridged-T bandpass filter further includes a first microstrip line having a first conductor and a second conductor.

17. A high frequency amplifier claimed in claim 16, wherein a first end of said first conductor and a first end of said second conductor are opened and a second end of said first conductor is connected to said input terminal, a second end of said second conductor being connected to said output terminal.

18. A high frequency amplifier claimed in claim 16, wherein said bridged-T bandpass filter further includes a second microstrip line having a third conductor and a fourth conductor.

19. A high frequency amplifier claimed in claim 18, wherein a first end of said third conductor and a first end of said fourth conductor are short-circuited, a second end of said third conductor being connected to a connection node between said first and second resistors, and a second end of said fourth conductor being connected to ground.

* * * * *